United States Patent [19]

Leduc

[11] Patent Number: 5,089,873
[45] Date of Patent: Feb. 18, 1992

[54] INTEGRATED CIRCUIT HAVING A VERTICAL TRANSISTOR

[75] Inventor: Pierre Leduc, Colleville-Montgomery, France

[73] Assignee: U.S. Philips Corp., New York, N.Y.

[21] Appl. No.: 474,832

[22] PCT Filed: Dec. 18, 1989

[86] PCT No.: PCT/NL89/00098
§ 371 Date: Sep. 24, 1990
§ 102(e) Date: Sep. 24, 1990

[87] PCT Pub. No.: WO90/07194
PCT Pub. Date: Jun. 28, 1990

[30] Foreign Application Priority Data
Dec. 16, 1988 [FR] France .................. 88 16641

[51] Int. Cl.[5] .............. H01L 29/06; H01L 29/72; H01L 27/02
[52] U.S. Cl. .................... 357/35; 357/34; 357/36; 357/20; 357/43
[58] Field of Search ............ 357/34, 35, 36, 20, 357/43

[56] References Cited
U.S. PATENT DOCUMENTS
4,686,557  2/1987  Mahrla ............................... 357/36

FOREIGN PATENT DOCUMENTS
0228748   7/1987  European Pat. Off. .
1090329  10/1960  Fed. Rep. of Germany .

*Primary Examiner*—Rolf Hille
*Assistant Examiner*—Wael Fahmy
*Attorney, Agent, or Firm*—Steven R. Biren

[57] ABSTRACT

The invention relates to an integrated circuit including a vertical transistor having an emitter having at least one zone (12), a base (2) having a base contacting region (15) adjoining a major surface of the integrated circuit, and a collector (5). The base is less than or equal to the diffusion length of the minority charge carries in these regions. The ratio between the surface $S_x$ of a base contacting region (15) and the surface $S_M$ of a base contact window region is at least equal to 10, and when the base contacting region (15) has a surface smaller than 5 times that of the emitter region. The transistor exhibits improved inverse current amplification.

5 Claims, 2 Drawing Sheets 5,089,873

INTEGRATED CIRCUIT HAVING A VERTICAL TRANSISTOR

BACKGROUND OF THE INVENTION

The invention relates to a semiconductor device comprising a semiconductor body with an integrated circuit having a vertical transistor comprising a collector zone of a first conductivity type, a base region of a second conductivity type disposed on at least a part of the collector region and an emitter region comprising at least one zone of the first conductivity type included in a part of the base region adjoining a major surface of the semiconductor body.

In known bipolar transistors, the inverse current amplification $\beta_I$ defined as the ratio between the emitter current $I_E$ and the base current $I_B$ when the collector-base junction is polarized in the inverse sense is usually not very high.

However in certain applications, it is desirable to have available transistors having a high inverse current amplification $\beta_I$ of, for example several tens. In that case, it is possible to improve the collector-base voltage $V_{CEsat}$ of the transistor in saturation or, whilst utilizing the transistor in the inverse sense, to realize a multi-collector transistor.

SUMMARY OF THE INVENTION

The invention has for its object to provide for a semiconductor device comprising an integrated circuit with such a vertical transistor.

The invention is based on the recognition that, in case the overall thickness of the base is smaller than or equal to the diffusion length of the minority charge carriers in this region, the phenomena of injection of charge carriers obey quite different rules from those admitted by the conventional theories.

According to the invention a semiconductor device of the kind described above paragraph is characterized in that the overall thickness of the base is smaller than or equal to the diffusion length of the minority charge carriers in this region, in that the base region comprises at least one base contacting zone having at least one contact area adjacent to the said zone of the emitter region, this base contacting zone being covered by an isolating layer having a window, through which a contact is provided to the contact area, the ratio between the surface area of the base contacting zone and the surface area of the window being at least equal to 10, and in that the base contacting zone has a surface area smaller than 5 times the total surface area of the emitter region.

These dimensional ratios assure the realization of amplification values which are interesting in practice. More particularly, and paradoxically, said contact provides an improvement of the amplification which is more striking in proportion as its area in contact with the contacting zone is smaller.

According to a first embodiment, the base contact area is enclosed by a unique zone constituting the emitter region.

According to a second embodiment, the emitter region has at least two zones enclosing at least one surface of the said base contacting region.

According to a third advantageous embodiment, the emitter region has at least two pairs of zones, the two zones of one pair enclosing a surface of said base contacting region.

According to a preferred embodiment, the base region has a plurality of branches, each branch comprising a zone of the emitter region, while the base contact area is disposed in a central region with respect to the branches.

BRIEF DESCRIPTION OF THE DRAWING

The invention will be more clearly understood after reading the following description given by way of non-limitative example in conjunction with the drawing in which.

DESCRIPTION OF THE PREFERRED EMBODIMENTS

Figure 1A:
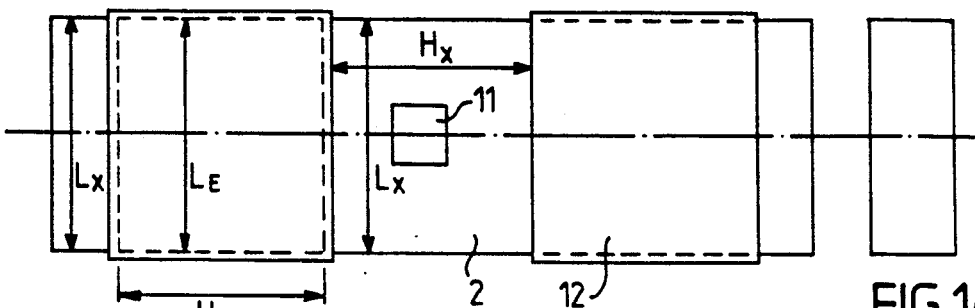
FIGS. 1a and 1b show in plan view and in sectional view, respectively, a first embodiment of the invention.
Figure 1B:
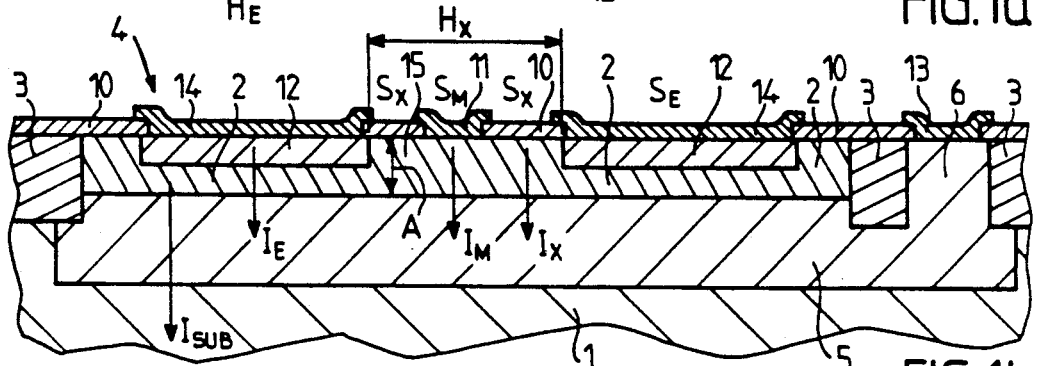

According to FIGS. 1a and 1b, an integrated circuit in accordance with the invention comprises a p-type substrate 1, on which a buried n+ layer 5 forming the collector of the vertical transistor and then a p-type base region 2 are provided. The buried layer 5 and the base region 2 may be formed by epitaxial growth on the substrate 1.

A layer 3 of deep oxide limits on the one hand a first island 4 for the vertical transistor and on the other hand a second n+ island 6 for collector contacting on the major surface of the circuit. The layer 3 of deep oxide is slightly deeper than the epitaxial layer 2.

Into the base region 2 are diffused two n-type emitter regions 12, which are separated from each other and form the emitter of the transistor.

The space 15 of the base 2 situated between the two zones 12 serves for base contacting. The part of the base region (2) beneath the emitter zones (12) constitutes the active base. An isolating layer 10, for example a thin oxide layer, formed on the whole surface of the integrated circuit has windows, through which the emitter regions 12, the base region 2 and the collector region 6 are contacted by a conductive layer 14, 11, 13.

The base 2 is such that its overall thickness A, which in this case corresponds approximately to the thickness of the epitaxial layer, is smaller than or equal to the diffusion length of the minority charge carriers in these regions.

In this case, to it has been recognized that the phenomenon of vertical injection can be modelled in a manner quite different from the conventional theories.

In the inverse mode of operation, the collector base junction is forward biassed, while the emitter-base is either reverse biassed or at zero voltage. The inverse amplification $\beta_I$ is the ratio between the emitter current $I_E$ and the base current $I_B$.

The two zones 12 forming the emitter each have a width $H_E$, a length $L_E$ and a surface area $S_E$.

The base region 2 adjoins at region 15 the major surface of the circuit, of which a part lying under the base window has a surface $S_M$ and of which the other part situated under the isolating layer 10 has a surface $S_x$. This region 15 forms a base contacting region.

The injected currents are represented in FIG. 1b and their values partly depend upon the base-collector voltage $V_BC$ and upon the dimension of the relevant zones.

The emitter current has the value:

$$I_E = 2S_E J_0 \left( e^{\frac{V_{Bc}}{V_T}} \right)$$

e = exponental

The current $I_M$ injected under the base contact (injection under metal) has the value:

$$I_M = S_M J_M \left( e^{\frac{V_{Bc}}{V_T}} - 1 \right)$$

The current $I_x$ injected under the oxide covering the base has the value:

$$I_x = S_x J_x \left( e^{\frac{V_{Bc}}{V_T}} - 1 \right)$$

The current $I_{sub}$ to the substrate has the value:

$$I_{sub} = J_s(2S_E + S_x + S_M) \left( e^{\frac{V_{Bc}}{V_T}} - 1 \right) \approx$$

$$J_s(2S_E + S_x) \left( e^{\frac{V_{Bc}}{V_T}} - 1 \right)$$

$J_O, J_M, J_x$ and $J_s$ designate the current densities injected into the emitter, under a metallic layer into the base region, under an oxide layer into the base region and to the substrate, respectively.

The recombination current in the buried layer 5 is neglected.

An example is:
$J_O = 500 \ 10^{-21} A/\mu m^2$
$J_M = 50 \ 10^{-21} A/\mu m^2$
$J_x = 1,3 \ 10^{-21} A/\mu m^2$
$J_s = 3,5 \ 10^{-21} A/\mu m^2$
Assuming $$\frac{V_{Bc}}{eV_T} >> 1 \text{ and } V_T = 26 \text{ mV},$$

the inverse current amplification can be expressed as:

$$\beta_I = \frac{I_E}{I_B} = \frac{2S_E J_0}{S_x J_x + S_M J_M + (2S_E + S_x)J_s} \text{ with}$$

$$I_B = I_x + I_m + I_{sub}$$

From this equation results that, in order to have a high value of $\beta_I$, it is necessary that the surface $S_m$ is as small as possible, because the preponderant term of the denominator is the term of $J_M$, which in this case largely exceeds $J_x$ and $J_s$, and it is also necessary that $S_x$ is small with respect to $S_E$.

The inverse of the amplification $1/\beta_I$ can be expressed as:

$$\frac{1}{\beta_I} = \frac{S_x(J_x + J_s) + S_M J_M + 2S_E J_s}{2S_E J_0}$$

$$\frac{1}{\beta_I} = \frac{S_x}{2S_E} \cdot \frac{(J_x + J_s)}{J_o} + \frac{S_M}{2S_E} \cdot \frac{J_M}{J_o} + \frac{J_s}{J_o}$$

i.e. with the numerical values of $J_s$, $J_x$, $J_M$ and $J_O$ given above:

$$\frac{1}{\beta_I} = \frac{1}{100} \left( 0,7 + 0,48 \frac{S_x}{S_E} + 5 \frac{S_M}{S_E} \right)$$

It appears that, for $S_M < 1/10 \ S_x$, the last term has a weight smaller than or equal to that of the foregoing but one. It is also necessary that the ratio $S_x/S_E$ is chosen small in order that the value of the amplification $\beta_I$ is sufficiently high.

The base contacting zone must therefore have a surface area smaller than approximately 5 times the total area of the emitter (2 $S_E$ in the example given above).

Let it be assumed that:
$H_E$ = width of an emitter zone,
$L_E$ = length of an emitter zone,
$H_x$ = width leaving room for a base contact,
$L_x$ = length of a base contact zone.

Let it be assumed that $S_x = H_x L_x$ (for $S_M << S_x$); let it be assumed that $H_x$ has the minimum value permitted by the method, for example 14 $\mu$m.

Let it be assumed that $L_E \approx L_x = 25$ $\mu$m and $S_M = 10$ $\mu m^2$. Then there is:

$$\frac{1}{\beta_I} = \frac{1}{100} \left( 0,7 + \frac{9}{H_E} \right)$$

Then the variation of $\beta_I$ as a function of $H_E$ is obtained.

| HE($\mu$m) | 5 | 10 | 20 | 50 | $\infty$ |
|---|---|---|---|---|---|
| $\beta_I$ | 40 | 62,5 | 87 | 113 | 143 |

In the above example, an emitter Width $H_E$ equal to 10 $\mu$m guarantees an inverse amplification $\beta_I$ exceeding 50.

For $H_E = 10$ $\mu$m and $L_E \approx L_x$, the influence of $L_E$ is considered.

There is:

$$\frac{1}{\beta_I} = \frac{1}{100} \left( 1,4 + \frac{5}{L_E} \right)$$

| LE($\mu$m) | 10 | 15 | 20 | 25 | 50 |
|---|---|---|---|---|---|
| $\beta_I$ | 52 | 57 | 60 | 62 | 66 |

Figure 3A:
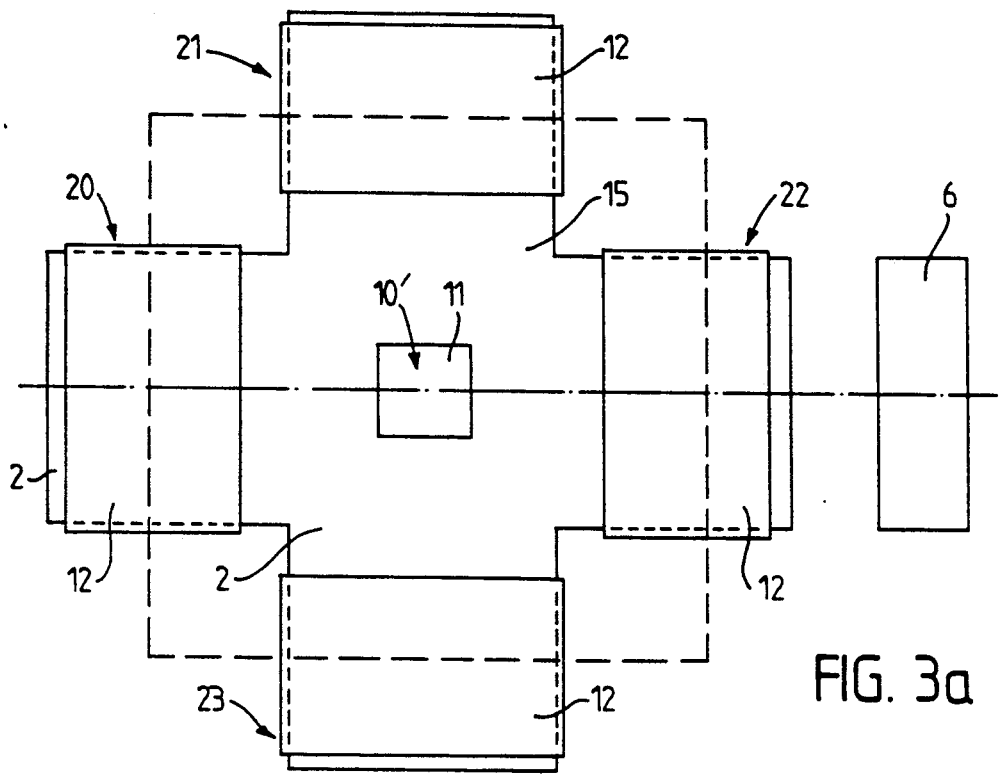
FIGS. 3a and 3b show a preferred embodiment of the invention.
Figure 3B:
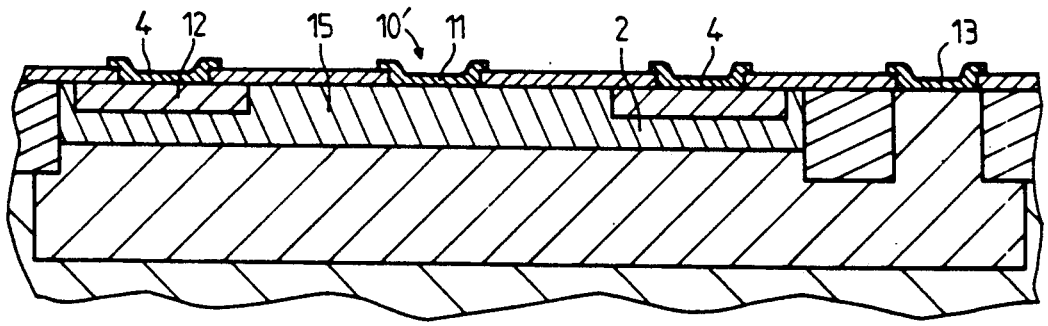

The length $L_E$ of the emitter zones has much less influence than the width of said zones. This shows that a very favourable form is that of elongate emitters. This is logical because, when $L_E$ is increased, $S_x$ also increases. Now the ratio of the surfaces is preponderant. The best results for $\beta_I$ are therefore obtained for $S_M$, $L_E$ and $L_x$ having the minimum value permitted by the method, and $H_E$ has the highest possible value attainable in practice, which corresponds to a form of transistor having elongate emitters in one or several favorable directions. FIGS. 3a and 3b also show a structure in the form of a cross of four branches (20 to 23) having an emitter comprising four zones 12 interconnected by a metallization strip indicated by a dotted line.

Figure 2A:
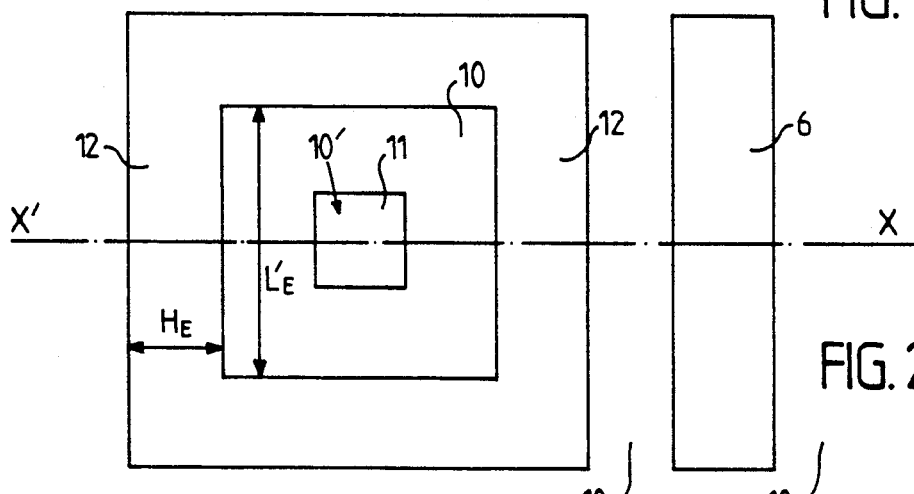
FIGS. 2a and 2b show in plan view and in sectional view, respectively, a second embodiment of the invention.
Figure 2B:
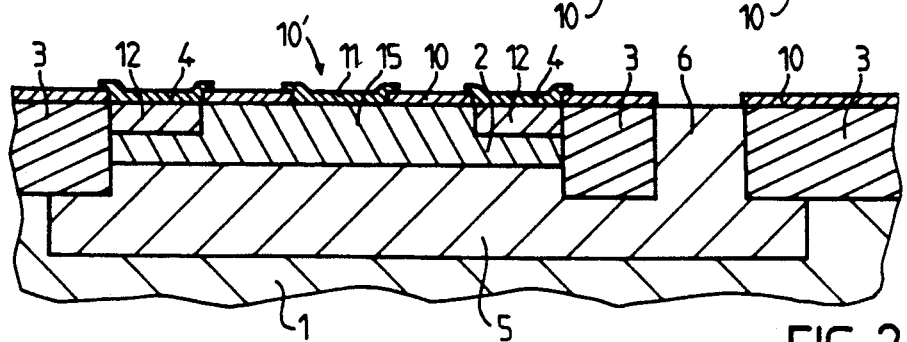

Another favorable form corresponds to the case shown in FIGS. 2a and 2b, in which the emitter has the form of a belt closed in itself and entirely surrounding the base which has the minimum sides permitted by the method, i.e. for example:

$S_M = 10 \ \mu m^2$
$S_x = 120 \ \mu m^2$
$H_E = 10 \ \mu m$ where:

$L'_E = 11 \ \mu m$

The surface of the emitter then has the value:

$$S_E = 4L'_E H_E + 4H_E = 840 \ \mu m^2$$

$$= \frac{1}{\beta_I} = \frac{S_x J_x + S_M J_M + (S_E + S_x + S_m)J_s}{S_E J_o}, \text{ rendering}$$

$$\frac{1}{\beta_I} = \frac{J_s}{J_o} + \frac{(J_x J_s)}{J_o} \frac{S_x}{S_E} + \frac{J_M + J_s}{J_o} \frac{S_m}{S_E} \approx$$

$$\frac{J_s}{J_o} + \frac{J_x J_s}{J_o} \frac{S_x}{S_E} + \frac{J_M}{J_o} \frac{S_m}{S_E}$$

This yields a value of about $\beta_I = 106$, with the values of $J_s$, $J_M$ and $J_O$ given hereinbefore by way of example.

Also, this structure yields a high amplification. It moreover has:

a lower base resistance; and a lower value with equal amplification of the junction capacitance, which renders this structure particularly advantageous.

Figure 4:
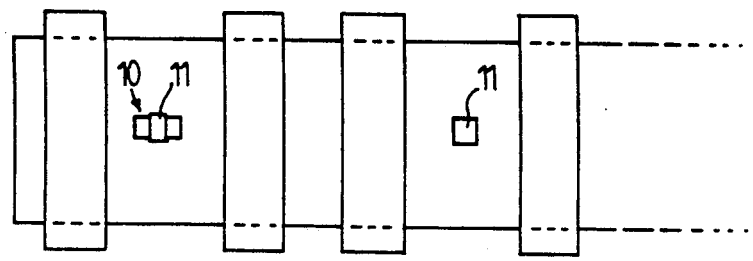
FIG. 4 shows a third embodiment of the invention.

A variation shown in FIG. 4 comprises a plurality of structures arranged in parallel having alternately an emitter zone, a base zone, two emitter zones, a base zone, etc. Another form having a lower inverse amplification consists in the alternation of an emitter zone and of a base zone.

The invention is not limited to the embodiments described and shown. In particular, although it has been described for the case of npn transistors, it may also be used for pnp transistors.

I claim:

1. A semiconductor device comprising a semiconductor body including an integrated circuit having a vertical transistor comprising a collector region of a first conductivity type, a base region of a second conductivity type disposed on at least a part of the collector region, and an emitter region comprising at least one zone of the first conductivity type included in a part of the base region adjoining a major surface of the semiconductor body, in which the overall thickness of the base region is smaller than or equal to the diffusion length of minority charge carriers in this region, and the base region comprises at least one base contacting zone having at least one contact area adjacent to the at least one zone of the first conductivity type of the emitter region, and an isolating layer covering the base contacting zone having a window through the isolating layer, and a base contact extending through the window to the contact area, the ratio between the surface area of the base contacting zone and the surface area of the window being at least equal to 10, and in which the base contacting zone has a surface area smaller than 5 times the total surface area of the emitter region.

2. An integrated circuit as claimed in claim 1, in which the base contacting zone comprises a contact area surrounded by a unique zone (12) constituting the emitter region.

3. An integrated circuit as claimed in claim 1, in which the emitter region (12) comprises at least two zones enclosing at least one surface of the said base contacting zone.

4. An integrated circuit as claimed in claim 3, in which the emitter region comprises at least two pairs of zones, and the zones of each pair enclose a different base contacting region (FIG. 4).

5. An integrated circuit as claimed in claim 1, in which the base region comprises a plurality of branches, and each branch comprises a zone of the emitter region, and the base contacting zone comprises a contact area provided in a central region with respect to the branches (20 to 23).

* * * * *